United States Patent [19]

Ericsson

[11] 4,221,165
[45] Sep. 9, 1980

[54] PRINTING MACHINE HAVING REGISTERING MEANS

[75] Inventor: Sylve J. D. Ericsson, Tumba, Sweden

[73] Assignee: Svecia Silkscreen Maskiner AB, Norsborg, Sweden

[21] Appl. No.: 854,200

[22] Filed: Nov. 23, 1977

[30] Foreign Application Priority Data

Nov. 24, 1976 [SE] Sweden ............................... 7613138

[51] Int. Cl.² ............................................ B05C 17/06
[52] U.S. Cl. ................................................... 101/126
[58] Field of Search ............... 101/118, 123, 124, 126; 271/241, 232, 245

[56] References Cited

U.S. PATENT DOCUMENTS

| | | | |
|---|---|---|---|
| 2,572,691 | 10/1951 | Bobst | 271/232 |
| 2,939,701 | 6/1960 | Schroter | 271/241 |
| 2,997,948 | 8/1961 | Scheeler | 101/126 |
| 3,536,004 | 10/1970 | Derrickson | 101/123 |
| 3,543,679 | 12/1970 | Wahl | 101/123 |
| 3,974,920 | 8/1976 | Bumann | 271/232 |

*Primary Examiner*—Edgar S. Burr
*Assistant Examiner*—A. Heinz
*Attorney, Agent, or Firm*—Burns, Doane, Swecker & Mathis

[57] ABSTRACT

A silkscreen printing machine, having a plurality of gripper arms, arranged to grip in a first position material to be printed upon and to move said material to a second position, the printing position, in which said material is printed upon. Each gripper arm is arranged to be registered at least in said second position. For registering the material in the first position of the gripper arm, the material is provided with first registering means. Second registering means are fixed relative to the frame of the printing machine. The first and second registering means are caused to co-act with each other, and said second registering means are adjustable in the direction of movement of the gripper arms.

5 Claims, 4 Drawing Figures

U.S. Patent
Sep. 9, 1980
4,221,165
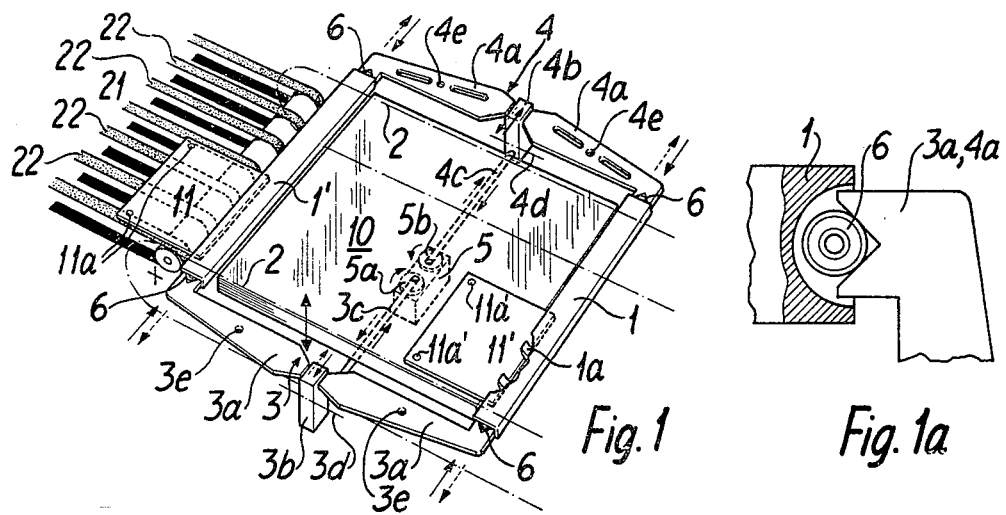
Fig. 1
Fig. 1a
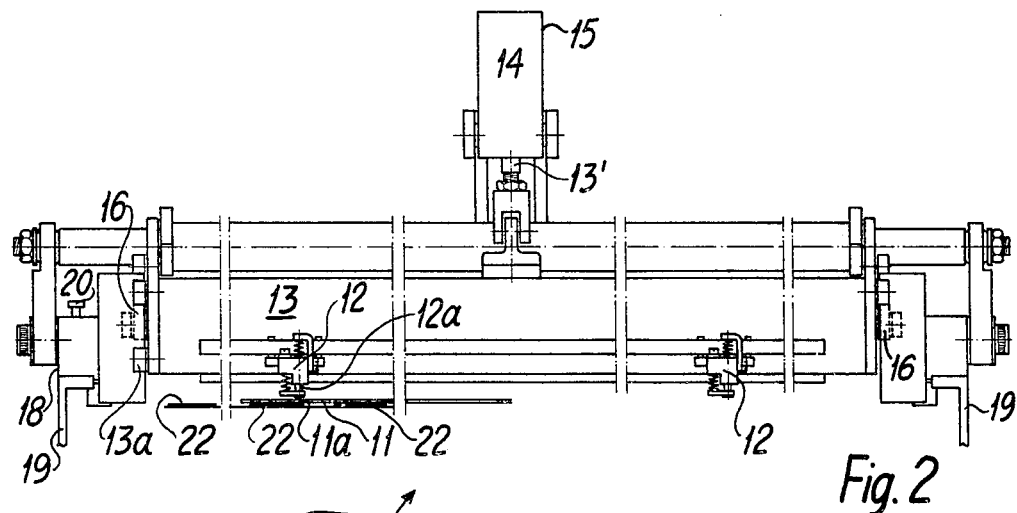
Fig. 2
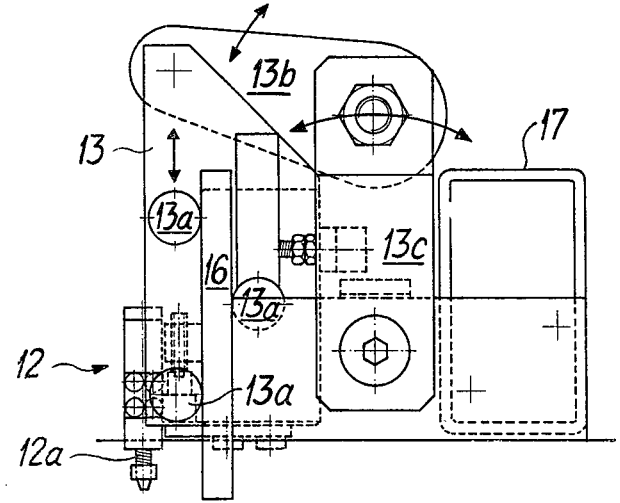
Fig. 3

PRINTING MACHINE HAVING REGISTERING MEANS

FIELD OF THE PRESENT INVENTION

The present invention relates to a printing machine having registering means, and preferably to an automatically operating printing machine having two or more, normally four, gripper bars or arms. The gripper arms are arranged to grip in a first position of alignment a sheet of material to be printed upon and to transport said sheet of material to a second position of alignment i.e. the printing position, in which the material is printed upon. Each gripping arm is arranged to be registered in the first position of alignment and in the second position of alignment. By "registered" is meant here and in the following description, that each gripper arm adopts an exactly defined position relative to the printing table, the stencil and the machine frame.

The present invention can be applied to any type of printing machine having the aforementioned characteristics, although in the following description the printing machine is assumed to have the form of a silkscreen printer.

BRIEF DESCRIPTION OF THE PRIOR ART

It is well known that one prerequisite for a precisely related printing result is based on the assumption that the sheet to be printed upon is positioned accurately in the first position of alignment, i.e. the position to which the sheet is aligned when first placed on the printing table, and, primarily, also the printing position. It has been found in practice that known sheet-registering means are so constructed that if the sheet of material adopts a correct position of registry when the gripper arms are located in their first position of alignment, the sheet will also have a correct position of registry in the printing position.

Correct positioning of the sheet to be printed upon is normally effected with the aid of the leading edge of the material, this leading edge being placed relative to the gripper arm by means of a conveying means, whereafter when an electronically operating device indicates that said leading edge is correctly positioned relative to the gripper arm, said arm is actuated to grip the sheet. This positioning of the sheet relative to the gripper arm can also be effected with the aid of the side edges of the sheet.

It is now desired to improve the accuracy of this registering of the sheet still further, such improved registry being necessary when the material to be printed upon is a stiff or rigid material and in which the pattern to be printed shall be exactly related to the printing table or the stencil, with a high degree of accuracy. In these instances, special registering means are required, normally holes in the material. Such high requirements on the exact registry of a material to be printed upon relative to the printing table are to be found in the manufacture of printed circuit cards.

It has been found difficult to place the registering means in the material adjacent the leading edge of said material, and hence the registering means have normally been arranged in conjunction with the trailing edge of said material. Further, such cards which are to be provided with printed circuits are normally produced in small numbers, which means that the registering means mounted on the machine frame must be re-set quite regularly, the work involved therewith being quite complicated and time consuming.

OBJECTS OF THE PRESENT INVENTION

In order to overcome these disadvantages at least substantially the present invention relates to a printing machine in which the registering means can be adjusted in the direction of movement of the gripper arms and also perpendicularly to said direction of movement.

BRIEF DESCRIPTION OF THE DRAWINGS

So that the invention will be more readily understood and further features thereof made apparent, an exemplary embodiment of the invention will now be described with reference to the accompanying schematic drawings, in which:

FIG. 1 is a simplified perspective view of a silkscreen printing machine incorporating the invention, FIG. 1a is an enlarged view of the registering means for a gripper arm, FIG. 2 is a front view of the registering means which are fixed relative to the frame, and FIG. 3 is a side view of the arrangement shown in FIG. 2.

DESCRIPTION OF THE PREFERRED EMBODIMENT

FIG. 1 shows a printing machine considerably simplified in that parts have been omitted, in order to make the parts essential to an understanding of the invention more clearly visible. Thus for example a printing table together with a portion of the drive arrangements have not been shown. Such a machine includes a plurality of gripper arms 1 only two of which are shown in the Figure. The gripper arms 1 are joined at their respective ends to at least one and preferably two parallel endless drive chains or belts 2, associated with the machine. A number of gripping members 1a are arranged on each gripper arm. The machine further comprises a double-lever system formed of two oppositely arranged substantially identical levers 3 and 4. The respective levers are connected, by means of rods 3c and 4c, adapted to actuate the levers, to a drive member 5. Each lever is so formed, that it constitutes a stopping arrangement for each gripper arm 1, which arrangement will later be described in greater detail.

Each of the two levers 3 and 4 consist of two arms 3a, 4a disposed at the same height, but extending in opposite directions. The two arms in each lever of each pair of levers operate together via a link-member 3b, 4b joining the two. The rods 3c, 4c connect the link-members 3b, 4b to the drive member 5. One pair of arms, 4a as shown in the FIG. 1, is so formed that it permits a certain degree of springness in its plane of motion, while the other pair of arms may be rigid as it need not necessarily be sprung.

The link members 3b and 4b are pivotable and are supported in a plane at right-angles to the plane in which the arms 3a and 4a are arranged, so that they can be moved about bearing points 3d, 4d situated in each respective link-member. Each of rods 3c, 4c is connected to an eccentric disc respectively 5a, 5b one on each side of the drive member 5. The arms 3a and 4a are pivotably supported on a bearing point 3e, 4e respectively and are provided with a suitable shaped surface, which is preferably of V-form at its end remote from the link-member 3b, 4b which surface is turned towards the gripper arms. The gripper arms 1 are in turn provided, as shown in FIG. 1a, at their outermost ends with a bearing point 6 which may be, for example, roller bearings or ball bearings.

The feeding function of the printing machine operates essentially in the following manner. When discs 5a and 5b are rotated by the drive member 5, the rods 3c, 4c move outwardly away from the drive member 5, as shown by dashed arrows. The link-members 3b and 4b thus pivot about their bearing points 3d and 4d and bearing points 3e and 4e cause the outer ends of the arms 3a and 4a to move in the direction of the dashed arrows, that is to say away from the gripper arms 1. Thus the gripper arms are free to move and the gripper arm on the left can be moved by drive chain 2 to the right-hand position. When the rods 3c and 4c are moved reciprocally owing to the rotation of the discs 5a and 5b, they move together with the link-members 3b and 4b and the arms 3a and 4a in the opposite direction, that is to say in the direction indicated by the arrows in solid lines. The outer ends of the arms 3a and 4a approach each other to thus clamp the gripper arms 1 and positionally located same by interaction of the bearing point 6 with the shaped surface on the arms 3a, 4a.

When a sheet is inserted, the following occurs. Firstly the left-hand gripper arm 1', in the embodiment according to FIG. 1, is stopped in the first predetermined position, grips a sheet arranged in front of it, i.e. to the left of the gripper arm 1', after which the gripper arm is moved to the right as viewed in the FIG. 1, by the drive chains 2. Then the gripper arm is again stopped in another predetermined position, this position being represented in FIG. 1 by the right-hand gripper arm 1, the sheet being placed in the exact position required for printing on a printing table 10 or the like, which is located between the gripper arm 1 and the lever arms 4a, 3a. At the same time the next gripping arm 1' is stopped in the first predetermined position, so as to grip the next sheet to be printed.

So that the positioning of the sheet to be printed can be achieved as accurately as possible, it is necessary, partly that the gripping arrangement 1a can pick up the sheet to be printed exactly in the predetermined position without any displacement, and partly that the gripping arm 1, in the placing of the sheet on the printing table can be stopped exactly in the predetermined position. It is therefore of considerable importance for a good printing result, that the gripping arm 1 can be stopped and adjusted as accurately as possible in two predetermined positions. This is achieved in accordance with the invention in the following way.

Shortly before the gripping arms 1 have reached the predetermined position, in which they are intended to be stopped, the outer ends of the arms 3a and 4a are moved away from each other. This movement can for example be induced by a contact arrangement, not shown in the Figure, which is influenced, if a gripping arm 1 starts its movement or starts, during the passage of one of the arrangements fastened near one of the endless advancement chains 2 and which initiates the rotation of the discs 5a and 5b. This rotation is so regulated, that when the gripping arms 1 have almost reached the predetermined position, they are gripped tight by the lever arm members 3a and 4a which have then changed the direction of motion and now come nearer to each other. The fastening of a gripping arm 1 is brought about by the V-shaped notches on the outer ends of the two lever arm members 3a and 4a, which each enclose the ball bearing 6 arranged at the outer end of the gripping arm 1. At the same time, with the gripping fast of the gripping arms 1, the endless advancement chains 2 are stopped and become so slack, that an adjustment of the position of the gripping arms 1 becomes possible. The adjustment is carried out by the ball-bearings 6 under the effect of the gripping movement, that is, they roll into the centre of the notch. By this means, the ball bearings 6 take up a fixed predetermined position and with it the gripping arm 1, which position is predetermined by the position of the V-shaped notches.

The present invention now provides the possibility of further improving the accuracy in which the sheet to be printed is positioned upon its cooperation with the gripper arm in its first position of alignment by utilising, when positioning the material in said first position of alignment the gripper arm firstly registering means 11a formed in the material and secondly registering means 12 (FIG. 2), which are fixed relative to the frame of the printing machine. These two registering means 11a and 12 are caused to co-act with each other, thereby to ensure precise positioning of the material 11. The registering means 12, which are fixed relative to the machine frame, shall also be adjustable in the direction of movement of the gripper arms, thereby to enable the registering means 12 to be readily adapted in dependence upon the registering means formed in the material.

Registering of the gripper arms in the first position of alignment is effected simultaneously, or slightly prior to the time when the registering means 12, which are fixed relative to the machine frame, are caused to co-act with the registering means 11a formed in the material. The registering means 12 comprise one or more guide pins 12a, normally two or three for each sheet of material, while the registering means formed in the material comprise holes. The registering means 12, fixed in relation to the machine frame, are mounted on a beam 13 which can be moved up and down by means of a cylinder 14 having an associated piston 13'. The cylinder 14 and the piston 13' are controlled through lines 15 in a manner known per se. The beam 13 can be moved up an down, the registering means 12, fixed relative to the machine frame, being caused to co-act with the registering means 11a formed in the material upon downward movement of the beam 13.

The beam 13 is provided with three guide wheels 13a on each side thereof, said wheels being arranged on respective side of a guide bar 16 in a manner such that vertical movement of the beam 13 is accurately controlled. The guide bar 16 is fixedly mounted on a carrier means 17 for the beam 13, the end portions of the carrier means 17 being guided in horizontal guides 18 firmly mounted on the frame 19. By means of this arrangement, the beam 13 can be displaced in a direction parallel to the direction of movement of the gripper arms. By means of a tightening device 20 for the carrier means 17, both the beam 13 and also the registering means 12, fixed in relation to the machine frame, can be displaced to a selected position and fixed in said position and caused to co-act with the registering means 11a.

In order that the beam 13 moves along a parallel vertical path, up and down, the upper end portions of the beam 13 are pivotally connected with respective ends of arms 13b, the other ends of which are pivotally connected with vertically extending arms 13c. In this way it is ensured that the beam 13 is moved precisely vertically along a movement path parallel to the material by means of a single centrally fixed piston 13'.

The registering means fixed relative to the machine frame have not been shown in FIG. 1, although it should be noticed that the frame part 19 extends parallel to the infeed means 21 in the form of a plurality of mutually spaced belts 22.

Altough in practice it has been found satisfactory to arrange registering means 12, fixed relative to the machine frame, in the first position of alignment of the gripper arms, thereby to obtain a correctly positioned print on the material to be printed when said material is moved to the printing poistion, in which position the material is referenced 11', in the printing machine. In accordance with the present invention, it can be modified in a manner such that the printing table 10 also exhibits registering means in the form of pins, which are fixed relative to the machine frame, which pins in the printing position shall be caused to co-act with the registering means 11a'. These fixedly mounted registering means are caused to co-act with the registering means 11a' by the fact that the pins are caused to co-act with holes 11a' from beneath. Thus, the pins are inserted into holes in the printing table 10.

There should be at least two registering means 12 for each sheet of material and two or more sheets of material can be printed simultaneously. The registering means 12 are mounted on a bar and can be locked to the bar in selected positions therealong.

The invention is not restricted to the described and illustrated embodiment, but can be modified within the scope of the accompanying claims.

What is claimed is:

1. A printing machine, such as a silkscreen printing machine, comprising:

a plurality of gripper arms for gripping a material to be printed upon in a first location, and for moving said material to a printing location;

means for registering each gripper arm in a predetermined position at said printing location; and means for registering said material in a predetermined position at said first location including:

first registering means comprising holes formed in in the material to be printed upon, and second registering means, comprising guide pins mounted on said printing machine for movement in the direction of movement of said gripper arms to permit adjustment of the guide pins, for operatively engaging said first registering means to register said material in said predetermined position.

2. The printing machine of claim 1 further including means for registering each gripper arm in a predetermined position at said first location simultaneously with or slightly subsequent to the operative engagement of said first and second registering means.

3. A printing machine according to claim 1, characterized in that said material comprises a stiff sheet of material, such as a card on which a circuit is to be printed.

4. A printing machine according to claim 1, characterized in that said second registering means are firmly mounted on a beam which is arranged for vertical movement, and include means for moving said beam downwardly to engage said first and said second registering means.

5. A printing machine according to claim 4, further including means for guiding movement of said beam in a direction parallel to the direction of movement of the gripper arms, and means for fixing the position of said beam with respect to the guide means at any selected position.

* * * * *